United States Patent [19]

Kakubo et al.

[11] Patent Number: 4,999,628
[45] Date of Patent: Mar. 12, 1991

[54] ANALOG-TO-DIGITAL CONVERTING UNIT WITH BROAD DYNAMIC RANGE

[75] Inventors: Yuji Kakubo; Hiromi Sotome, both of Shizuoka, Japan

[73] Assignee: Yamaha Corporation, Hamamatsu, Japan

[21] Appl. No.: 539,433

[22] Filed: Jun. 15, 1990

[30] Foreign Application Priority Data

Jun. 29, 1989 [JP] Japan .................. 1-168929

[51] Int. Cl.$^5$ .............. H03M 1/62; H03M 1/84
[52] U.S. Cl. ..................... 341/139; 341/155
[58] Field of Search .............. 341/139, 126, 155

[56] References Cited

U.S. PATENT DOCUMENTS

| 4,010,462 | 3/1977 | Armistead | 341/139 |
| 4,383,247 | 5/1983 | Assard | 341/139 |
| 4,393,369 | 7/1983 | Davies | 341/139 |
| 4,399,416 | 8/1983 | Gillespie | 330/86 |
| 4,584,558 | 4/1986 | Maschek et al. | 341/139 |
| 4,674,062 | 6/1987 | Premerlani | 364/602 |
| 4,851,842 | 7/1989 | Iwamatsu | 341/139 |

OTHER PUBLICATIONS

Tani et al., "20-Bit-A-to-D and D-to-A Converting Systems for Digital Audio", IEEE Transactions on Consumer Electronics, vol. 35, No. 3, Aug., 1989, pp. 528–535.
Tani et al., "20-Bit A-to-D and D-to-A Converting Systems for Digital Audio", IEEE 1989 International Conference on Consumer Electronics, Jun. 6–9, 1989, pp. 210–211.

Primary Examiner—William M. Shoop, Jr.
Assistant Examiner—Helen Kim
Attorney, Agent, or Firm—Burns, Doane, Swecker & Mathis

[57] ABSTRACT

An analog-to-digital converting unit comprises an analog level varying circuit having a plurality of gains and varying a magnitude of an analog input signal for producing a plurality of analog output signals different in magnitude from one another with the respective gains, a plurality of analog-to-digital converting circuits respectively supplied with the analog output signals and producing a plurality of digital code signals, respectively, a controlling circuit supplied with two of the digital code signals and calculating a difference therebetween for producing a first control signal indicative of varying one of the digital code signals in value so as to be equal in value to the other digital code signal, a calculating circuit responsive to the first control signal and causing one of the digital code signals to be varied in value for producing a candidate of a digital output signal, and an output circuit coupled to one of the analog-to-digital converting circuits and to the calculating circuit and supplying the digital output signal to the output node. Since the value of the input analog signal is retrieved from the digital code signal on the basis of the difference, the analog-to-digital unit is free from any secular changes and any variation of operational ambient.

17 Claims, 6 Drawing Sheets

ANALOG-TO-DIGITAL CONVERTING UNIT WITH BROAD DYNAMIC RANGE

FIELD OF THE INVENTION

This invention relates to an analog-to-digital converting unit and, more particularly, to a technique for broadening a dynamic range of the analog-to-digital converting unit without sacrifice of a linearity.

DESCRIPTION OF THE RELATED ART

A problem is encountered in the prior art analog-to-digital converting unit in narrow dynamic range and, accordingly, in a small signal-to-noise ratio. In fact, a typical analog circuit is as large in the dynamic range as 120 dB, however, the dynamic range of a 16-bit analog-to-digital converting unit is of the order of 96 dB, and any analog-to-digital converting unit with more than 16-output bits is less feasible because of the trimming technology as of now. On the other hand, a digital signal processing unit currently available is much longer in length than 16 bits, and 24-bit and 32-bit microprocessors are, by way of example, widely used in a data processing system. In this situation, if a digital signal processing unit responsible to a data code longer than 16 bits is coupled between analog circuits, the analog-to-digital converting unit needs to be increased in the responsible dynamic range, and one of the techniques is known as "floating modulation".

FIG. 1 shows a typical example of the analog-to-digital converting unit to which the floating modulation technique is applied. The analog-to-digital converting unit shown in FIG. 1 comprises a plurality of level amplifiers 1A, 1B, . . . . . having respective gains G1, G2, . . . . different from one another (G1> G2> . . . . ) and supplied in parallel with an analog input signal, a plurality of sampling-and-holding circuits 2A, 2B, . . . . coupled to the level amplifiers 1A, 1B, . . . . . , respectively, a level detecting circuit 3 monitoring the analog output signals fed from the level amplifiers 1A, 1B, . . . . and producing a control signal CNT indicative of one of the analog output signals with an appropriate range, a selector 4 responsive to the control signal CNT and operative to become transparent to one of the voltage signals fed from the sampling-and-holding circuits 2A, 2B, . . . . , an analog-to-digital converting circuit 5 operative to convert the voltage signal fed through the selector 4 into a digital code, and an n-bit shifter 6 responsive to the control signal CNT and producing a digital signal equivalent to the analog input signal.

The analog-to-digital converting unit thus arranged behaves as follows. When the analog input signal is supplied in parallel to the level amplifiers 1A, 1B, . . . . , the level amplifiers 1A, 1B, . . . . increase the analog input signal depending upon the respective gains thereof, and produce the analog output signals, respectively, the analog output signals are supplied from the level amplifiers 1A, 1B, . . . . to not only the associated sampling-and-holding circuits 2A, 2B, . . . . but also the level detecting circuit 3. The sampling-and-holding circuits 2A, 2B, . . . . are responsive to a sampling clock signal (not shown) and respectively produce the voltage signals indicative of respective discrete voltage levels at application of each sampling clock pulse. The voltage signals thus produced are supplied from the sampling-and-holding circuits 2A, 2B, . . . . to the selector 4. On the other hand, the level detecting circuit 3 monitors all of the analog output signals to see if any analog output signal or signal's exceeds a predetermined voltage level, and decides the most appropriate analog output signal for the analog-to-digital conversion. The most appropriate analog output signal has the largest peak value under the predetermined voltage level. The level detecting circuit 3 then produces the control signal CNT on the basis of the decision, and the control signal CNT is supplied in parallel to the selector 4 and the n-bit shifter 6. With the control signal CNT, the selector is transparent to the voltage signal corresponding to the most appropriate analog output signal, and the discrete voltage level indicated by the voltage signal is converted into a digital code the value of which is representative of the discrete voltage level. The digital code is transferred to the n-bit shifter 6, and the n-bit shifter 6 shifts the bit string of the digital code in a predetermined direction by bits depending upon the analog output signal selected by the level detecting circuit 3. Namely, assuming now that the most appropriate analog output signal is produced by one of the level amplifiers with the gain Gn, the number of bits to be shifted by the shifter 6 is determined in such a manner that the value of the digital output signal is 1/Gn of that of the original digital code. If the analog-to-digital converting circuit 5 is assumed to have a linear zone indicative of the dynamic range thereof shown in FIG. 2, the dynamic range of the analog-to-digital unit is broadened as shown in FIG. 3 by assigning the level amplifiers 1A, 1B, . . . . to respective ranges R1, R2, R3, . . . in an overlapping manner.

Thus, the prior art analog-to-digital converting unit regulates the analog input signal prior to the analog-to-digital conversion, then converts into a digital code and shifts the bit string of the digital code, thereby retrieving the value indicated by the analog input signal. If the analog-to-digital converting unit is incorporated in a delay circuit or a recording system, the digital output signal may be produced directly on the basis of the digital code and a piece of information indicative of the voltage level to be regulated; however, the analog-to-digital converting unit incorporated in a numeral analysis system usually reforms the bit string of the digital code fed from the analog-to-digital converting circuit into an extended data format.

The prior art analog-to-digital converting unit thus arranged has a drawback in precision in the analog-to-digital conversion. In detail, it is important for the prior art analog-to-digital converting unit to cause the value of the regulation to precisely correspond to the number of bits to be shifted after the analog-to-digital conversion. In general, the component elements of the level amplifiers 1A, 1B, . . . . contain individual variations, respectively, and need to be subjected to a trimming operation. However, even though the component elements are trimmed during the manufacturing, each of the component elements tends to fluctuate in characteristics due to, for example, operational environment and secular changes. This results in the insufficient precision between the analog input signal and the output digital signal If an analog signal is retrieved from a series of the output digital signals, the analog signal is liable to lose the linearity and, therefore, suffers from discontinuity.

SUMMARY OF THE INVENTION

It is therefore an important object of the present invention to provide an analog-to-digital converting unit which is free from the variation in operational environment and the secular changes.

To accomplish the object, the present invention proposes to produce a reference digital code signal for retrieving the value of an analog input signal from a digital code signal on the basis of a difference between the reference digital code signal and the digital code signal.

In accordance with the present invention, there is provided an analog-to-digital converting unit comprising a) an input node supplied with an analog input signal, b) an output node supplied with a digital output signal equivalent to the analog input signal, c) analog level varying means having a plurality of gains and varying a magnitude of the analog input signal for producing a plurality of analog output signals different in magnitude from one another with the respective gains, d) a plurality of analog-to-digital converting circuits respectively supplied with the analog output signals and producing a plurality of digital code signals, respectively, e) a controlling circuit supplied with two of the digital code signals and calculating a difference therebetween for producing a first control signal indicative of varying one of the digital code signals in value so as to be approximately equal in value to the other digital code signal, f) calculating means responsive to the first control signal and causing aforesaid one of the digital code signals to be varied in value for producing a candidate of the digital output signal, and g) output means coupled to one of the analog-to-digital converting circuits and to the calculating means and supplying the digital output signal to the output node.

BRIEF DESCRIPTION OF THE DRAWINGS

The features and advantages of an analog-to-digital converting unit according to the present invention will be more clearly understood from the following description taken in conjunction with the accompanying drawings in which.

DESCRIPTION OF THE PREFERRED EMBODIMENTS

First Embodiment

Figure 4:
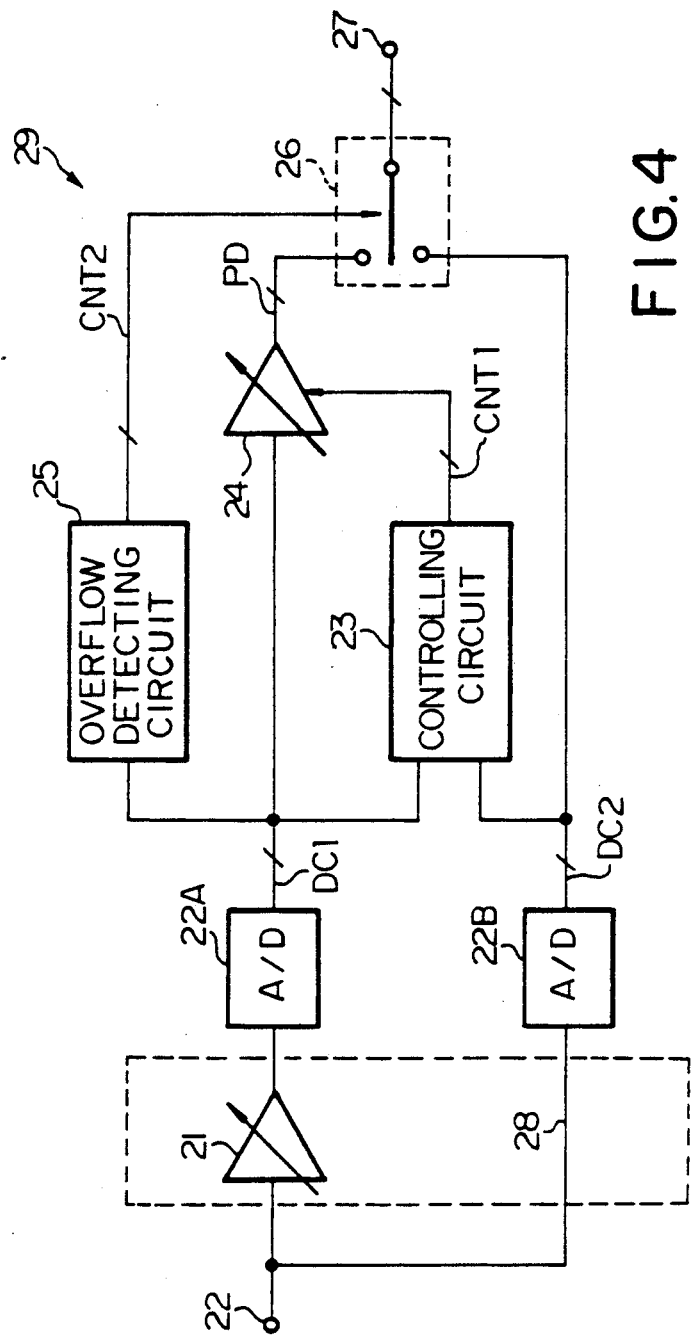
FIG. 4 is a block diagram showing the arrangement of an analog-to-digital converting unit according to the present invention.

Referring first to FIG. 4 of the drawings, an analog-to-digital converting unit embodying the present invention comprises a variable-gain amplifier circuit 21 coupled at the input node thereof to an input node 22, first and second analog-to-digital converting circuits 22A and 22B respectively coupled to the input and output nodes of the variable-gain amplifier circuit 21 and producing first and second digital code signals DC1 and DC2, respectively a controlling circuit 23 operative to calculate a difference between the first and second digital code signals DC1 and DC2 for producing a first control signal CNT1 indicative of a multiplier, a multiplier circuit 24 supplied with the first digital code signal DC1 serving as a multiplicand and the first control signal for producing a product signal PD, an overflow detecting circuit 25 monitoring the first digital code signal DC1 for detecting an overflow state and producing a second control signal CNT2, and a selector 26 responsive to the second control signal CNT2 for transferring either of the product signal PD and the second digital code signal DC2 to an output node 27. An analog input signal is supplied to the input node 22, and a digital output signal appears at the output node 27. In this instance, the overflow detecting circuit 25 produces the second control signal CNT2 in the overflow state, however, the overflow detecting circuit 25 may produce the second control signal CNT2 upon detecting approximate state to the overflow. The variable-gain amplifier circuit 21 forms analog level varying means together with a bypassing path 28 between the input node 22 and the analog-to-digital converting circuit 22B, and, for this reason, the analog level varying means has two different gains one of which is approximately equal to "1". Calculating means are implemented by the multiplier 24, and the overflow detecting circuit 25 and the selector 26 as a whole constitute output means 29.

The variable-gain amplifier circuit 21 is manipulated by an operator so as to behave in an arbitrary dynamic range, and the dynamic range thus selected is assumed to be "G1" in the following description. If the variable-gain amplifier circuit 21 is tuned to gain "G1" and no variation takes place in the characteristics of the amplifier 21, the first control signal CNT1 is indicative of the multiplier equivalent to "1/G1" in this instance. However, if some variations take place in the characteristics of the variable-gain amplifier circuit 21 and, accordingly, the gain is changed to "G1'" without intention, the first control signal CNT1 is indicative of the multiplier of "1/G1'" because the difference between the first and second digital code signals are also varied. Thus, the first control signal CNT1 indicative of the multiplier follows the fluctuation of the gain, and, for this reason, the digital output signal strictly equivalent in value to the analog input signal.

Each of the analog signals is converted into the 16-bit digital code, but the multiplier 24 is responsible to 24-bit data codes, and the bit expansion is achieved in the final stages of the analog-to-digital converting circuits 22A and 22B, thereby improving the precision of the digital processing. Namely, if any rounding error less than a half of the least significant bit is introduced in the 24-bit product signal PD, it is possible to ignore the rounding error in an analog signal converted from the digital output signal again.

The analog-to-digital converting unit thus arranged behaves as follows. When the analog input signal is supplied to the input node 22, the variable-gain amplifier circuit 21 increases the magnitude of the analog input signal depending upon the gain tuned by the operator, and the analog output signal increased in magnitude is fed from the variable-gain amplifier circuit 21 to the first analog-to-digital converting circuit 22A, but the analog input signal is directly transferred through the bypassing path 28 to the second analog-to-digital converting circuit 22B. The first analog-to-digital converting circuit 22A converts the analog output signal into the first digital code signal DC1 equivalent in value to the analog output signal, and the analog input signal is converted into the second digital code signal DC2 also equivalent to the analog input signal. The first and second digital code signals DC1 and DC2 are supplied to the controlling circuit 23, and the controlling circuit 23 subtracts the value of the second digital code signal DC2 from the value of the first digital code signal DC1. The controlling circuit further is operative to determine the multiplier on the basis of the difference between the first and second digital code signals DC1 and DC2, and the first control signal CNT1 indicative of the multiplier is produced by the controlling circuit 23.

The first digital code signal DC1 is further supplied to the multiplier 24 as the multiplicand, and the value of the first digital code signal DC1 is multiplied by the value of the first control signal CNT1. The product signal PD thus calculated is supplied from the multiplier 24 to the selector 26, and the second digital code signal DC2 is directly supplied to the selector 26.

If no overflow takes place in the first digital code signal DC1, the overflow detecting circuit 25 produces the second control signal CNT2 indicative of the product signal PD, and the selector is transparent to the product signal PD so that the product signal PD is transferred to the output node 27 as the digital output signal. This improves the signal to noise ratio and expands the dynamic range of the analog-to-digital converting unit. On the other hand, if the analog input signal is out of the dynamic range of the variable-gain amplifier circuit 21, an overflow takes place in the first digital code signal DC1, and the overflow is detected by the overflow detecting circuit 25. In this situation, the overflow detecting circuit 25 produces the second control signal indicative of the second digital code signal DC2, and the selector 26 transfers the second digital signal DC2 to the output node 27 as the digital output signal.

If the gain of the amplifier circuit 24 is varied without any tuning operation, the analog output signal and, accordingly, the first digital code signal DC1 are changed in value, but the second digital code signal DC2 remains constant. This results in variation of the difference between the first and second digital code signals DC1 and DC2, and the first control signal CNT1 requests the multiplier 24 to cancel the variation of the gain. Of course, even though the operator adjusts the gain to a large or small value "G2", the difference between the first and second digital code signals DC1 and DC2 automatically follows the new gain "G2", and the product signal is as large in value as the second digital code signal DC2 in the presence of the first control signal CNT1 indicative of the multiplier of "1/G2".

As will be understood from the foregoing description, a desirable linearity is achieved by the analog-to-digital converting unit according to the present invention even though any variation takes place in the gain of the amplifier circuit 21.

Moreover, no switching or selecting element is provided in the analog signal propagation path of the circuit arrangement shown in FIG. 4. A switching or selecting element such as the selector 26 of the prior art example is causative of distortion, however, the analog-to-digital converting unit according to the present invention is free from the undesirable distortion because the selector 26 is provided in the digital signal propagation path. Thus, the circuit arrangement shown in FIG. 4 is advantageous in fidelity as well as in high speed operation.

Figure 1:
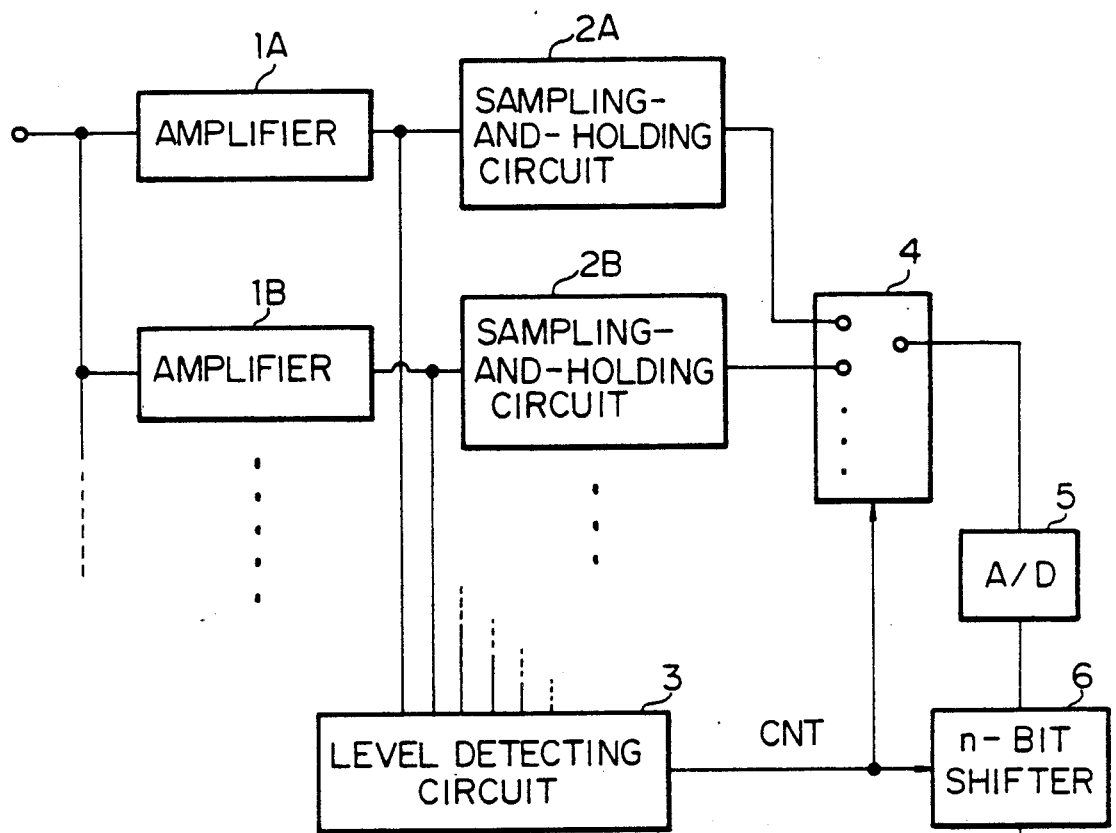
FIG. 1 is a block diagram showing the arrangement of a prior art analog-to-digital converting unit.
Figure 2:
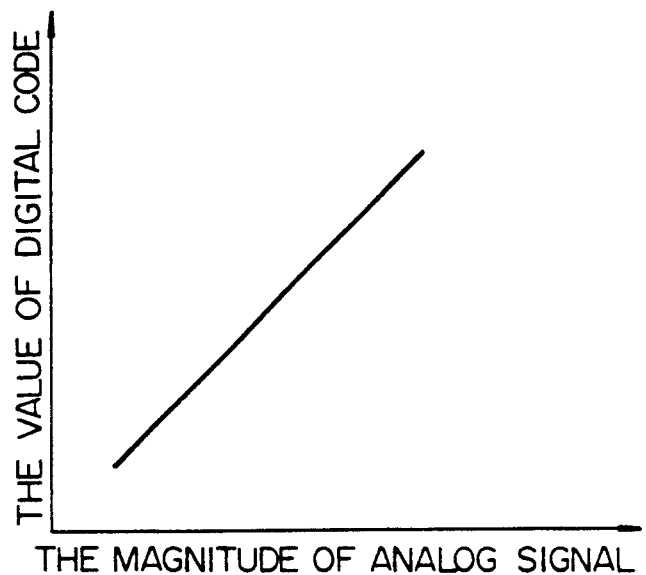
FIG. 2 is a graph showing the dynamic range of an analog-to-digital converting circuit incorporated in the prior art analog-to-digital converting unit.
Figure 3:
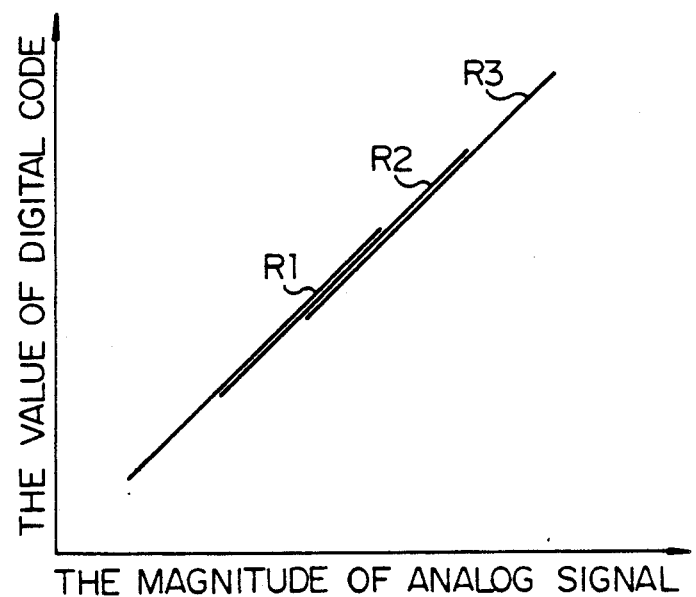
FIG. 3 is a graph showing the expanded dynamic range of the prior art analog-to-digital converting unit.

The analog-to-digital converting unit according to the present invention is further advantageous over the prior art example shown in FIG. 1 in retrieval of the original analog value. In detail, the prior art example shown in FIG. 1 retrieves the original value through the shifting operation, but the shifting operation increases or decreases the value of the digital code signal by the factor of "2" or "½" (corresponding to 6dB). However, the analog-to-digital converting unit according to the present invention retrieves the original analog value through the multiplication, and the resolution is, therefore, drastically improved because the multiplier can be varied by an extremely small factor.

Second Embodiment

Figure 5:
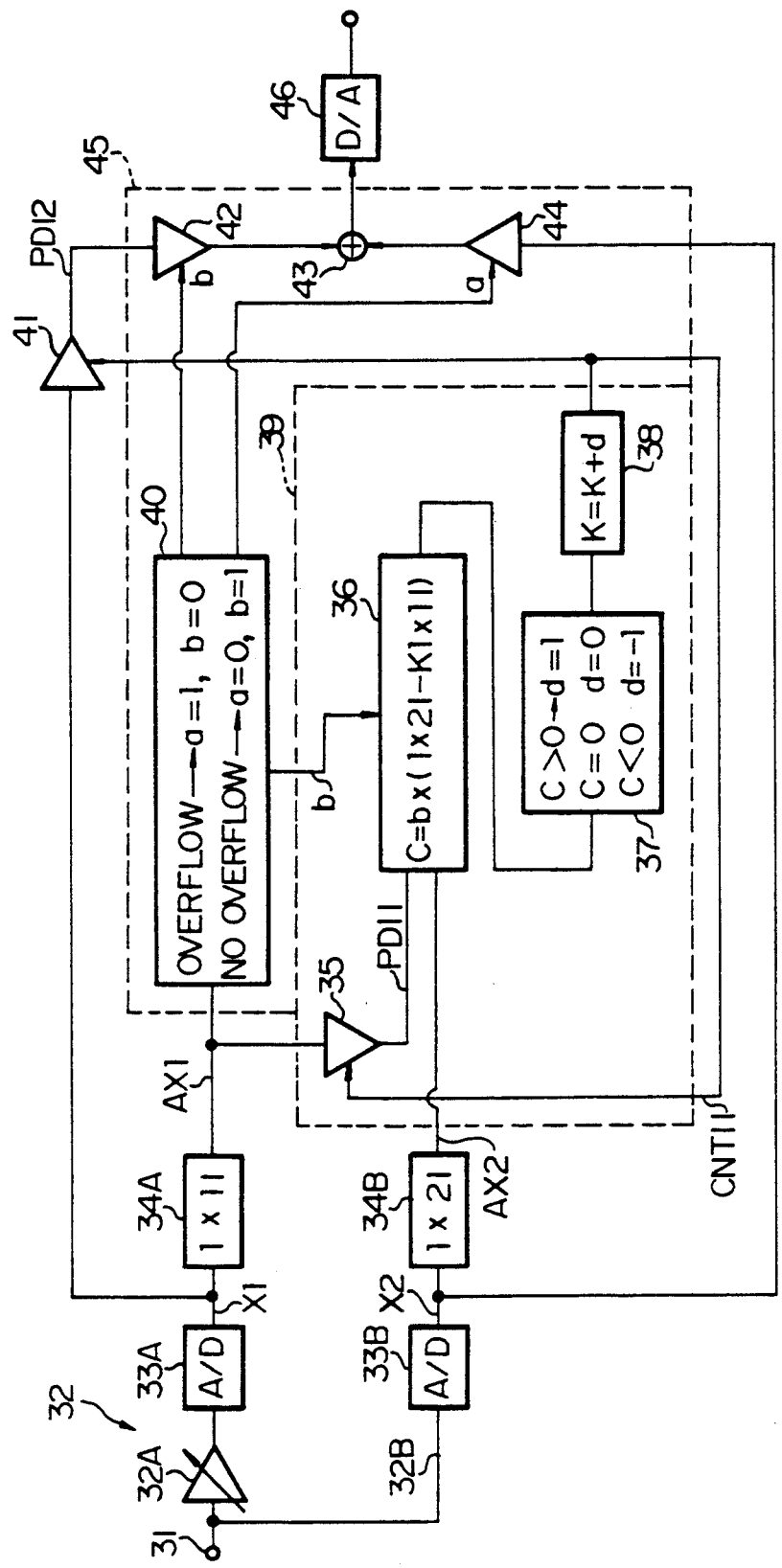
FIG. 5 is a block diagram showing another analog-to-digital converting unit embodying the present invention.

Turning to FIG. 5 of the drawings, another analog-to-digital converting unit according to the present invention is illustrated. An analog input signal fed to an input node is supplied to a variable-gain amplifier circuit 32A, and the variable-gain amplifier circuit 32A increases the magnitude of the analog input signal with a gain G3 for producing an analog output signal. The analog output signal is supplied to an analog-to-digital converting unit 33A, and the analog input signal is further supplied through a bypassing line 32B to another analog-to-digital converting circuit 33B. The variable-gain amplifier circuit 32A and the bypassing line 32B form in combination analog level varying means 32.

The analog-to-digital converting circuits 33A and 33B produce digital code signals X1 and X2, respectively, and the digital code signals X1 and X2 are supplied to absolute value circuits 34A and 34B, respectively. Digital code signals AX1 and AX2 fed from the absolute-value circuits 34A and 34B are respectively indicative of the absolute values of the numbers indicated by the digital code signals X1 and X2. The digital code signal AX1 is supplied to a multiplier 25 as a multiplicand, and the multiplier 35 is further supplied with a first control signal CNT11 indicative of a multiplier k. A product signal PD11 is supplied from the multiplier 35 to an arithmetic circuit 36 where the difference between the absolute value indicated by the digital code signal AX2 and the product indicated by the product signal PD11 is multiplied by a coefficient b. The product c thus produced in the arithmetic circuit 36 is supplied to a comparator circuit 37, and the comparator circuit 37 compares the product c with zero. If the product c is equal to zero, the comparator circuit 37 produces an addend d of zero. However, when the product c is greater or less than zero, the addend d is "1" or "−1". The addend d is fed to an adder 38, and is added to the multiplier k for producing a new multiplier k. The new multiplier k is fed back to the multiplier circuit 35, and the arithmetic circuit 36, the comparator circuit 37 and the adder 38 as a whole constitute a controlling circuit 39. As will be described hereinbelow, the coefficient b of value "1" is indicative of no occurrence of overflow in the digital code signal AX1, but the coefficient b of value "0" indicates an occurrence of overflow. If an overflow takes place and, accordingly, value "0" is given to the coefficient b, the product c has value "0" regardless of the difference between the absolute value and the product, and, therefore, the first control signal CNT11 or the multiplier k is maintained in the previous value due to the addend of "0". However, if no overflow takes place, value "1" is given to the coefficient b, and the multiplier k is regulated in such a manner as to cancel the product c.

The digital code signal AX1 is further fed to an overflow detecting circuit 40, and is checked to see whether or not an overflow takes place. If the overflow takes place, the overflow detecting circuit 40 decides that the coefficients a and b are "1" and "0", respectively. However, if no overflow takes place, values "0" and "1" are given to the coefficients a and b, respectively.

The digital code signal X1 is further supplied to a multiplier circuit 41 as a multiplicand, and the value of the digital code signal X1 is multiplied by the multiplier k indicated by the first control signal CNT11. The product between the digital code signal X1 and the first control signal CNT11 is supplied to a multiplier for multiplying by the coefficient b. Since the coefficient b of "1" is indicative of no occurrence of overflow, a product signal PD12 indicative of the product between the digital code signal X1 and the first control signal CNT11 is transferred to an adder 43; however, an occurrence of overflow causes the product to have value "0". The digital code signal X2 is further fed to a multiplier circuit 44 as a multiplicand, and the value of the digital code signal X2 is multiplied by the value of the coefficient a. Since an occurrence of overflow results in the coefficient a of "1", the digital code signal X2 is transferred from the multiplier 44 to the adder 43; however, no occurrence of overflow results in the product of "0". Thus, one of the multiplier circuits 42 and 44 produces zero, and the other multiplier transfers the value fed thereto to the adder 43. As a result, a digital output signal produced at the adder 43 is approximately equal to the product signal PD12 or the digital code signal X2. The multiplier 41 serves as calculating means, and the overflow detecting circuit 40, the multiplier circuits 42 and 44 and the adder 43 as a whole constitute output means 45.

The analog-to-digital converting unit thus arranged is associated with a digital-to-analog converting unit 46, and the digital output signal is converted into an analog signal again.

In this instance, the first control signal CNT11 is indicative of the multiplier k approximately equal to 1/G3. However, the multiplier k may be greater than 1/G3, and the digital output signal is increased in magnitude with respect to the analog input signal. In such an implementation, a magnitude ratio between the analog input signal and the digital output signal may be 1 : G3. However, a good linearity is achieved in any analog-to-digital converting unit according to the present invention.

Third Embodiment

Figure 6:
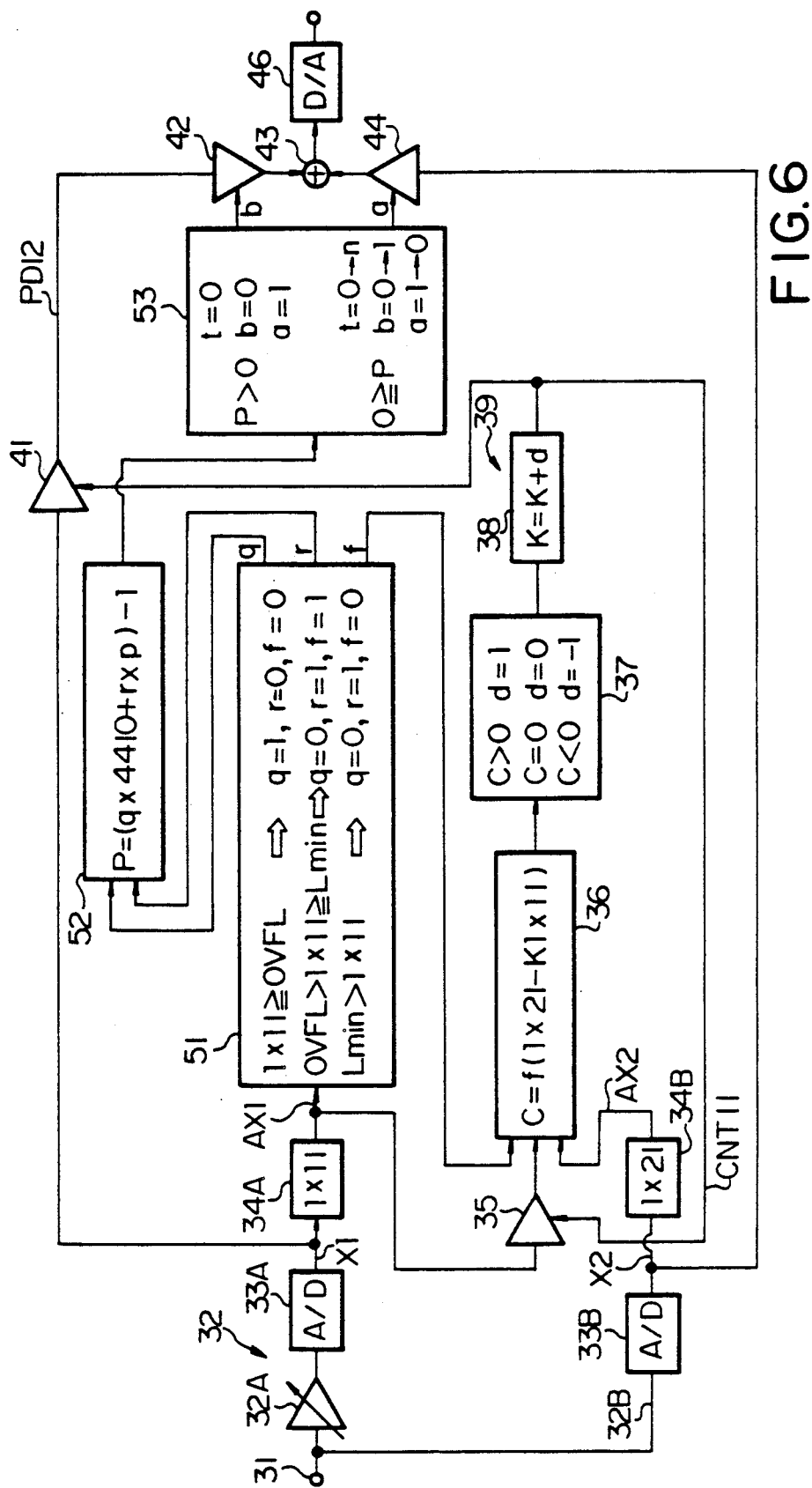
FIG. 6 is a block diagram showing the arrangement of still another analog-to-digital converting unit according to the present invention.

Turning to FIG. 6 of the drawings, still another analog-to-digital converting unit is illustrated and similar in arrangement to the analog-to-digital converting unit shown in FIG. 5 with the exception that the overflow detecting circuit 40 is replaced with a level detecting circuit 51, a time interval measuring circuit 52 and a cross-fading circuit 53. For this reason, description is focused upon these circuits 51 to 53, and the other component circuits and signals are designated by the same reference numerals used in FIG. 5 without any detailed description.

The level detecting circuit 51 sequentially compares the absolute value indicated by the digital code signal AX1 with an overflow level OVFL representative of an occurrence of overflow and a noise level Lmin. If the absolute value is less than the overflow level OVFL but not less than the noise level Lmin, the level deciding circuit 51 gives values "0", "1" and "1" to coefficients g, r and f, respectively. With the coefficient f, the arithmetic circuit 36 produces the product c, however, the product c always has value "0" in the other cases due to the coefficient f of "0". Namely, if the absolute value is equal to or greater than the overflow level OVFL, the coefficients g, r and f are "1", "0" and "0", respectively. Moreover, when the absolute value is less than the noise level Lmin, the values "0", "1" and "0" are given to the coefficients g, r and f, respectively. The coefficients g and r are supplied to the time interval measuring circuit 52. In the time interval measuring circuit 52, a constant value "4410" is multiplied by the value of the coefficient g, and the value indicated by the current status code P is multiplied by the value of the coefficient r. The product (4410q) is added to the product (rP), and value "1" is subtracted from the sum of the products for producing a new status code P.

If the status code P is indicative of a positive value, the cross-fading circuit 53 supplies the coefficients a of "1" and b of "0" in synchronism with a clock signal, and, for this reason, a time period t for fade-in or fade-out is approximately equal to zero. If the status code P is equal to or less than zero, the coefficient b is gradually increased from zero to one but the coefficient a is decreased from one to zero over the time period t of n.

Figure 7:
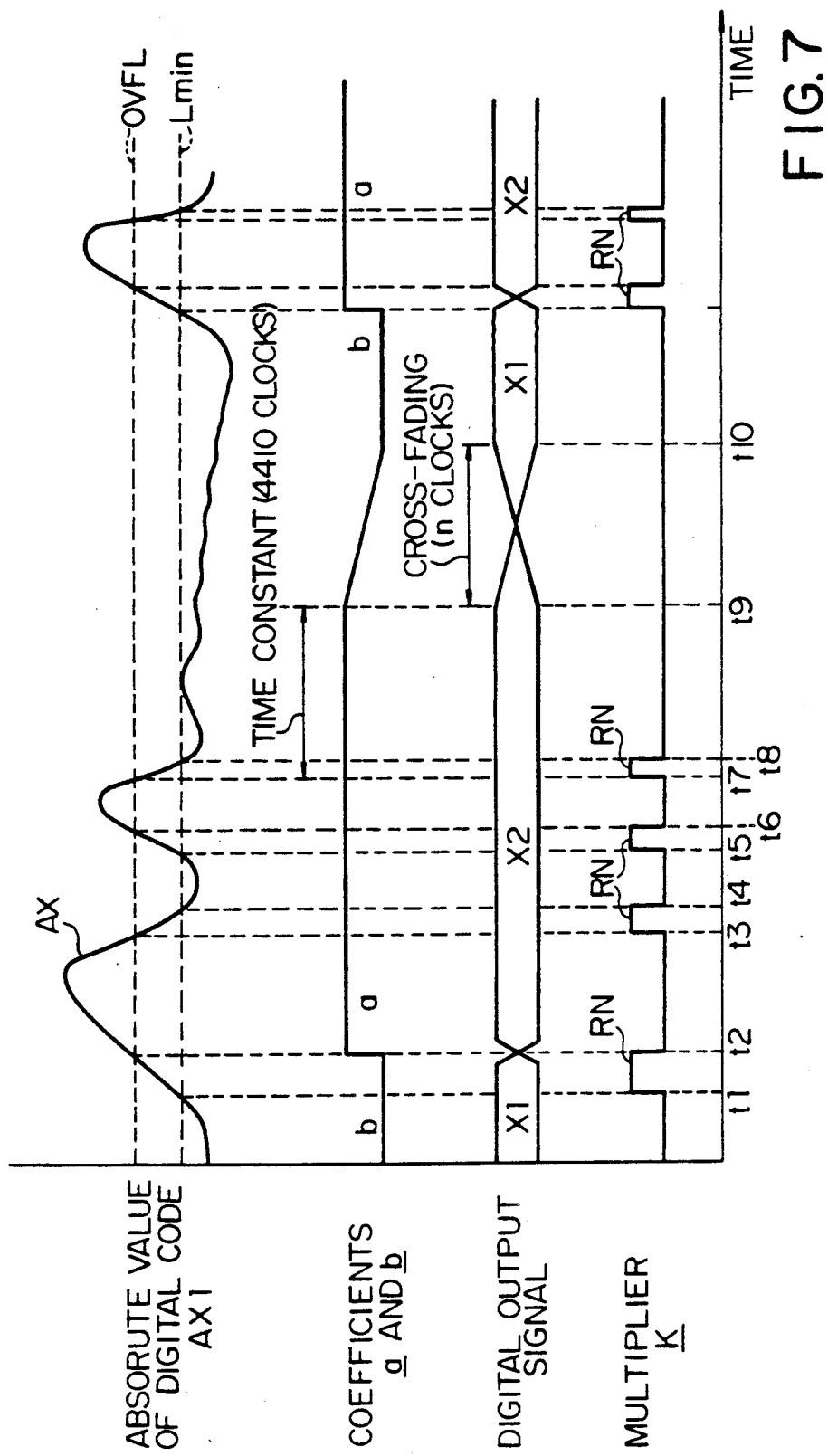
FIG. 7 is a graph showing the waveforms of essential signals produced in the analog-to-digital converting circuit shown in FIG. 6.

The circuit behavior of the analog-to-digital converting unit shown in FIG. 6 is hereinbelow described with reference to FIG. 7. In the following description, the absolute values less than the noise level Lmin is referred to as "noise zone", and the absolute values equal to or greater than the overflow level OVFL is referred to as "overflow zone". Moreover, the range between the noise zone and the overflow zone is called as "normal zone". Assuming now the discrete absolute values indicated by the digital code signal AX1 fluctuates as shown in Plots AX, the level deciding circuit 51 supplies the coefficient f of zero in the presence of the absolute value not less than the overflow level OVFL or less than the noise level Lmin, and the multiplier k is not incremented nor decremented. However, while the absolute value is fallen within the range between the overflow level OVFL and the noise level Lmin, the multiplier k is either incremented or decremented over time periods RN.

At time t1, the absolute value is changed from the noise zone to the normal zone, but the translation does not have any influence on the coefficients g and r, and the status code P remains in negative. This results in that the digital output signal is equal to the digital code signal X1. However, if the absolute value enters the overflow zone at time t2, the coefficients g and r are changed to "1" and "0", respectively, and the status code P has a positive value of "4410". When the status code P remains in positive, the digital output signal is immediately switched to the digital code X2. While the status code P remains positive, the absolute value fluctuates from the overflow zone to the normal zone at time t3, from the normal zone to the noise zone at time t4 and from the noise zone to the normal zone at time t5, the digital output signal is still produced on the basis of the digital code signal X2.

If the absolute value enters the overflow zone again at time t6, the status code P is set to value "4410" again, and is decremented from time t6 through time t7. However, after time t8, the absolute value remains in the noise zone for a long time period, and the status code P reaches zero at time t9, then the coefficients a and b are gradually decreased and increased over the time period equivalent to n clocks. Then, the cross-fading takes place over the time period n, and the digital output signal is produced on the basis of the digital code signal X1 again at time t10.

Thus, the analog-to-digital converting unit shown in FIG. 6 is less sensitive to the fluctuation of the absolute value, and prevents an user such as a listener from uncomfortable noises frequently produced upon exchanging between the digital code signals X1 and X2 due to difference in noise level.

As will be understood from the foregoing description, since the analog-to-digital converting unit according to the present invention causes the digital code signal converted from the amplified analog signal to be multiplied by a multiplier produced on the basis of the difference between the digital code signals in the different ranges, the digital output signal is equivalent in value to the original analog input signal, and variations in characteristics of the analog amplifier circuit do not have any influences on the equivalence between the analog input signal and the digital output signal.

Although particular embodiments of the present invention have been shown and described, it will be obvious to those skilled in the art that various changes and modifications may be made without departing from the spirit and scope of the present invention.

What is claimed is:

1. An analog-to-digital converting unit comprising
   (a) an input node supplied with an analog input signal,
   (b) an output node supplied with a digital output signal equivalent to said analog input signal,
   (c) analog level varying means having a plurality of gains and varying a magnitude of the analog input signal for producing a plurality of analog output signals different in magnitude from one another with said respective gains,
   (d) a plurality of analog-to-digital converting circuits respectively supplied with said analog output signals and producing a plurality of digital code signals, respectively,
   (e) a controlling circuit supplied with two of said digital code signals and calculating a difference therebetween for producing a first control signal indicative of varying one of said digital code signals in value so as to be approximately equal in value to the other digital code signal,
   (f) calculating means responsive to said first control signal and causing said one of the digital code signals to be varied in value for producing a candidate of said digital output signal, and
   (g) output means coupled to one of said analog-to-digital converting circuits and to said calculating means and supplying said digital output signal to said output node.

2. An analog-to-digital converting unit as set forth in claim 1, in which said analog level varying means comprises a variable gain amplifier circuit and a bypassing path for transferring said analog input signal directly to said one of said analog-to-digital converting circuits.

3. An analog-to-digital converting unit as set forth in claim 1, in which each of said plurality of analog-to-digital converting circuits converts each of the analog output signals into each digital code signal which is expanded in bit length for producing said candidate of said digital output signal.

4. An analog-to-digital converting unit as set forth in claim 1, in which said first control signal is indicative of multiplier, and in which said calculating means achieves a multiplication between the value of said one of said digital code signals and the value of said first control signal.

5. An analog-to-digital converting unit as set forth in claim 4, in which said multiplier is as large in value as a reciprocal of one of said gains for said analog output signal converted into said one of said digital code signals.

6. An analog-to-digital converting unit as set forth in claim 1, in which said output means comprise a selector responsive to a second control signal and transferring one of said candidate of said digital output signal and the digital code signal produced in said one of said analog-to-digital converting circuits to said output node, and an overflow detecting circuit supplied with said one of said digital code signals and checking to see whether or not an overflow of bit takes place in said one of said digital code signals for producing the second control signal.

7. An analog-to-digital converting unit as set forth in claim 1, in which said output means comprises a selector responsive to a second control signal and transferring one of said candidate of said digital output signal and the digital code signal produced in said one of said analog-to-digital converting circuits to said output node, and an overflow detecting circuit supplied with said one of said digital code signals and checking to see whether or not approximate state of an overflow of bit takes place in said one of said digital code signals for producing the second control signal.

8. An analog-to-digital converting unit as set forth in claim 1, in which said analog level varying means comprises a variable gain amplifier circuit and a bypassing path for transferring said analog input signal directly to said one of said analog-to-digital converting circuits.

9. An analog-to-digital converting unit as set forth in claim 8, in which said analog-to-digital converting unit further comprises a plurality of absolute-value circuits coupled between said analog-to-digital converting circuits and said controlling circuit for producing first and second absolute digital code signals indicative of the absolute values of said one and the other digital code signals, respectively.

10. An analog-to-digital converting unit as set forth in claim 10, in which said calculating means comprises a multiplier circuit multiplying the value of said one of said digital code signals by the value of said first control signal for producing a digital product signal serving as said candidate.

11. An analog-to-digital converting unit as set forth in claim 11, in which said output means comprise an overflow detecting circuit checking said first absolute digital code signal to see whether or not an overflow of bit takes place, said overflow detecting circuit producing first and second coefficients with respective values of one and zero upon detecting the overflow, said overflow detecting circuit producing said first and second coefficients with respective values of zero and one if no overflow takes place, said output means further comprising a first output multiplier circuit multiplying the value of said digital product signal by the value of said second coefficient for producing a first output product signal, a second output multiplier circuit multiplying the value of the other digital code signal by the value of said first coefficient for producing a second output product signal, and an adder for producing said digital output signal through an adding operation between said first and second output product signals.

12. An analog-to-digital converting unit as set forth in claim 11, in which said controlling circuit comprises a multiplier circuit multiplying the value of said first absolute digital code signal by the value of said first control signal, an arithmetic circuit multiplying the value of said second coefficient by a difference between the value of said second absolute digital code signal and the product between said first absolute digital code signal and said first control signal for producing a first status code, a comparator circuit comparing said first status code with zero and producing an addend of zero in the presence of the first status code of zero or the addend of either positive or negative value in the presence of the first status code of either positive or negative value, and an adder for giving a new value to said first control signal through adding said addend to a current value of the first control signal.

13. An analog-to-digital converting unit as set forth in claim 10, in which said output means comprises a level detecting circuit checking said first absolute digital code signal to see if the value of the first absolute digital code signal is within a noise zone, a normal zone or an overflow zone for producing first, second and third coefficients, said first, second and third coefficients being one, zero and zero respectively if the value of said first absolute digital code signal is within said overflow zone, said first, second and third coefficients being zero, one and one respectively if the value of said first absolute digital code signal is within said normal zone, said first, second and third coefficients being zero, one and zero respectively if the value of said first absolute digital code signal is within said noise zone, said output means further comprising a time interval measuring circuit subtracting a constant value from the sum of a product between said first coefficient and predetermined value and a product of said second coefficient and a current value of a first status code for giving a new value to the first status code, a cross-fading circuit comparing the new value of said first status code with zero and varying fourth and fifth coefficients in opposite directions between one and zero over a predetermined time interval in the presence of the first status code not greater than zero but maintaining the fourth and fifth coefficients at zero in the presence of the first status code greater than zero, a first output multiplier circuit supplied with said digital product signal and said fifth coefficient for producing a first output product signal, a second output multiplier circuit supplied with the other digital code signal and said fourth coefficient for producing a second output product signal, and an adder supplied with said first and second output product signals for producing said digital output signal.

14. An analog-to-digital converting unit as set forth in claim 13, in which said constant value is one.

15. An analog-to-digital converting unit as set forth in claim 14, in which said predetermined value is four thousand four hundred and ten.

16. An analog-to-digital converting unit as set forth in claim 13, in which said controlling circuit comprises a multiplier circuit multiplying the value of said first absolute digital code signal by the value of said first control signal for producing a control product signal, an arithmetic circuit multiplying the value of said third coefficient by a difference between the value of said second absolute digital code signal and the value of said control product signal for producing a second status code, a comparator circuit producing an addend code of zero in the presence of the second status code indicative of a value of zero and giving a positive value or a negative value to the addend code in the presence of the second status code with the value greater than zero or less than zero, and an adder adding the value of the addend to the current value of said first control signal for giving a new value to the first control signal.

17. An analog-to-digital converting unit comprising
(a) an input node supplied with an analog input signal,
(b) an output node supplied with a digital output signal equivalent to said analog input signal,
(c) a variable-gain amplifier circuit coupled to said input node and increasing a magnitude of said analog input signal with a selected gain for producing an analog output signal,
(d) a first analog-to-digital converting circuit coupled to said variable-gain amplifier circuit and producing a first digital code signals,
(e) a second analog-to-digital converting circuit coupled to said input node and producing a second digital code signal,
(f) a controlling circuit supplied with said first and second digital code signals and calculating a difference therebetween for producing a first control signal indicative of a multiplier with a value approximately equal to a reciprocal of the value of said selected gain,
(g) a multiplier circuit multiplying the value of said first digital code signal by the value of said first control signal for producing a digital product signal,
(h) an overflow detecting circuit checking said first digital code signal to see whether or not an overflow of bit takes place and producing a second control signal, and
(i) a selector responsive to said second control signal and transferring one of said digital product signal and said second digital code signal to said output node.

* * * * *